(12) United States Patent
Zhou

(10) Patent No.: US 7,612,384 B2
(45) Date of Patent: Nov. 3, 2009

(54) REFLECTIVE ELECTRODE FOR A SEMICONDUCTOR LIGHT EMITTING APPARATUS

(75) Inventor: Ling Zhou, Dublin, CA (US)

(73) Assignee: Philips Lumileds Lighting Company, LLC, San Jose, CA (US)

( * ) Notice: Subject to any disclaimer, the term of this patent is extended or adjusted under 35 U.S.C. 154(b) by 0 days.

(21) Appl. No.: 12/361,568

(22) Filed: Jan. 29, 2009

(65) Prior Publication Data

US 2009/0134419 A1    May 28, 2009

Related U.S. Application Data

(62) Division of application No. 11/420,337, filed on May 25, 2006, now Pat. No. 7,501,295.

(51) Int. Cl.
*H01L 33/00* (2006.01)
*H01L 21/00* (2006.01)

(52) U.S. Cl. .................. 257/98; 257/432; 257/E31.127; 438/29; 438/530; 438/627

(58) Field of Classification Search .................. None
See application file for complete search history.

(56) References Cited

U.S. PATENT DOCUMENTS

| | | | |
|---|---|---|---|
| 5,917,202 A | 6/1999 | Haitz et al. | |
| 6,100,586 A | 8/2000 | Chen et al. | |
| 6,287,947 B1 | 9/2001 | Ludowise et al. | |
| 6,593,160 B2 | 7/2003 | Carter-Coman et al. | |
| 6,812,502 B1 | 11/2004 | Chien et al. | |
| 6,861,340 B2 | 3/2005 | Takeya | |
| 6,900,472 B2 | 5/2005 | Kondoh et al. | |
| 6,946,372 B2 | 9/2005 | Kim | |
| 6,992,334 B1 | 1/2006 | Wierer, Jr. et al. | |
| 7,501,295 B2 * | 3/2009 | Zhou | 438/29 |
| 2004/0182914 A1 | 9/2004 | Venugopalan | |

* cited by examiner

*Primary Examiner*—Alonzo Chambliss
(74) *Attorney, Agent, or Firm*—Patent Law Group; Rachel Leiterman

(57) ABSTRACT

A process is disclosed for forming a reflective electrode on a semiconductor light emitting device, the light emitting device having an active layer for generating light and a cladding layer in electrical contact with the active layer. The process involves depositing an intermediate layer of electrically conductive material on the cladding layer and causing at least a portion of the electrically conductive material to diffuse into the cladding layer. The process further involves depositing a reflective layer on the intermediate layer, the reflective layer being electrically conductive and in electrical contact with the intermediate layer.

13 Claims, 3 Drawing Sheets

REFLECTIVE ELECTRODE FOR A SEMICONDUCTOR LIGHT EMITTING APPARATUS

CROSS-REFERENCE TO RELATED APPLICATIONS

This application is a division of application Ser. No. 11/420,337, filed May 25, 2006 and incorporated herein by reference.

BACKGROUND OF THE INVENTION

1. Field of Invention

This invention relates generally to semiconductor light-emitting devices and more specifically to reflective electrodes for semiconductor light-emitting devices.

2. Description of Related Art

Semiconductor light-emitting devices such as light-emitting devices (LED's) provide efficient sources of light and are more robust than incandescent light bulbs and fluorescent tubes. Advancements in LED technology and processing have facilitated the use of such devices as replacements for traditional lighting sources in commercial and residential lighting applications, for example.

LED's used for lighting applications generally include a reflective electrode that reflects a portion of the light generated by the device and also functions as a contact for providing a drive current to the device. The electrode material generally includes a metal. For some semiconductor materials it is difficult to find a metal for the reflective electrode that provides good electrical contact, good reflectivity, and good adhesion to the semiconductor material. For these semiconductor materials, a plurality of layers may be used to make up the reflective electrode. For example, the reflective electrode may include a first layer that provides good adhesion and good electrical contact, and a second layer that provides high reflectivity. Unfortunately, the first layer may also significantly attenuate the light before it reaches the second reflective layer, thus reducing the efficiency of the LED.

There remains a need for improved reflective electrodes for semiconductor light-emitting devices and improved processes for forming such electrodes.

SUMMARY OF THE INVENTION

In accordance with one aspect of the invention there is provided a process for forming a reflective electrode on a semiconductor light emitting device, the light emitting device having an active layer for generating light and a cladding layer in electrical contact with the active layer. The process involves depositing an intermediate layer of electrically conductive material on the cladding layer and causing at least a portion of the electrically conductive material to diffuse into the cladding layer. The process further involves depositing a reflective layer on the intermediate layer, the reflective layer being electrically conductive and in electrical contact with the intermediate layer.

The process may involve removing a portion of the intermediate layer before depositing the reflective layer.

After causing the electrically conductive material to diffuse into the cladding layer, the intermediate layer may include a first portion diffused into the cladding layer and a second portion remaining on the cladding layer, and removing may involve removing a majority of the second portion of the intermediate layer.

Causing at least the portion of the electrically conductive material to diffuse into the cladding layer may involve annealing the light emitting device.

Annealing may involve annealing the light emitting device for a duration and at a temperature sufficient to cause the electrically conductive material to diffuse into the cladding layer to a diffusion depth of about 50 nm.

The cladding layer may include p-type semiconductor material and depositing the intermediate layer may involve depositing a material having a work function as close as possible to the sum of an electron affinity energy and a bandgap energy of the p-type semiconductor material.

Depositing the material may involve depositing a metal selected from the group consisting of rhodium, palladium, nickel, platinum, gold, iridium, and rhenium.

Depositing the material may involve depositing a conductive oxide.

The cladding layer may include n-type semiconductor material and depositing the intermediate layer may involve depositing a material having a work function close to or smaller than an electron affinity energy of the n-type semiconductor material.

Depositing the material may involve depositing a metal selected from the group consisting of aluminum, titanium, chromium, vanadium, and tantalum.

The active layer may be operably configured to emit light at a first wavelength, and depositing the reflective layer may involve depositing a material having an increased reflectivity at the first wavelength.

Depositing the reflective layer may involve depositing at least one metal selected from the group consisting of aluminum, rhodium, palladium, silver, gold, magnesium, and nickel.

In accordance with another aspect of the invention there is provided a structure for use in a semiconductor light emitting apparatus. The structure includes a first cladding layer, and an active layer in electrical contact with the first cladding layer, the active layer being operable to generate light. The apparatus also includes a second cladding layer in electrical contact with the active layer, the second cladding layer having an outer face. The apparatus further includes a reflective electrode on the outer face of the second cladding layer, the reflective electrode including an intermediate layer of electrically conductive material, the electrically conductive material being at least partially diffused into the second cladding layer. The reflective electrode also includes a reflective layer on the intermediate layer, the reflective layer being electrically conductive and in electrical contact with the intermediate layer, the reflective layer being operable to reflect light generated in the active layer back through the second cladding layer, the active layer, and the first cladding layer.

The structure may further include a substrate in contact with the first cladding layer, the substrate being operably configured to permit the light to exit the structure through the substrate.

The intermediate layer may include a diffused portion of the electrically conductive material in the second cladding layer and an un-diffused portion of the electrically conductive material on the second cladding layer, the un-diffused portion being sufficiently thin to permit light generated in the active layer to be transmitted through the un-diffused portion without significant attenuation.

The intermediate layer may include a diffused layer of electrically conductive material extending into the second cladding layer to a diffusion depth of about 50 nm.

The second cladding layer may include p-type semiconductor material and the intermediate layer may include a material having a work function as close as possible to the sum of an electron affinity energy and a bandgap energy of the p-type semiconductor material.

The metal may include a metal selected from the group consisting of rhodium, palladium, nickel, platinum, gold, iridium, and rhenium.

The material may include a conductive oxide.

The second cladding layer may include n-type semiconductor material and the intermediate layer may include a metal having a work function close to or smaller than an electron affinity energy of the n-type semiconductor material.

The metal may include a metal selected from the group consisting of aluminum, titanium, chromium, vanadium, and tantalum.

The first and second cladding layers and the active layer may include group III-nitride semiconductor materials.

The active layer may be operably configured to emit light at a first wavelength, and the reflective layer may include a material having an increased reflectivity at the first wavelength.

The reflective layer may include at least one metal selected from the group consisting of aluminum, rhodium, palladium, silver, gold, magnesium, and nickel.

In accordance with another aspect of the invention there is provided a semiconductor light emitting apparatus including the above semiconductor light emitting structure. The semiconductor light emitting apparatus further includes an electrode in electrical contact with the first cladding layer. Light is generated in the active layer when a voltage is applied between the electrode and the reflective electrode such that a forward bias current flows through the active layer.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

In drawings which illustrate embodiments of the invention.

DETAILED DESCRIPTION

Figure 1:
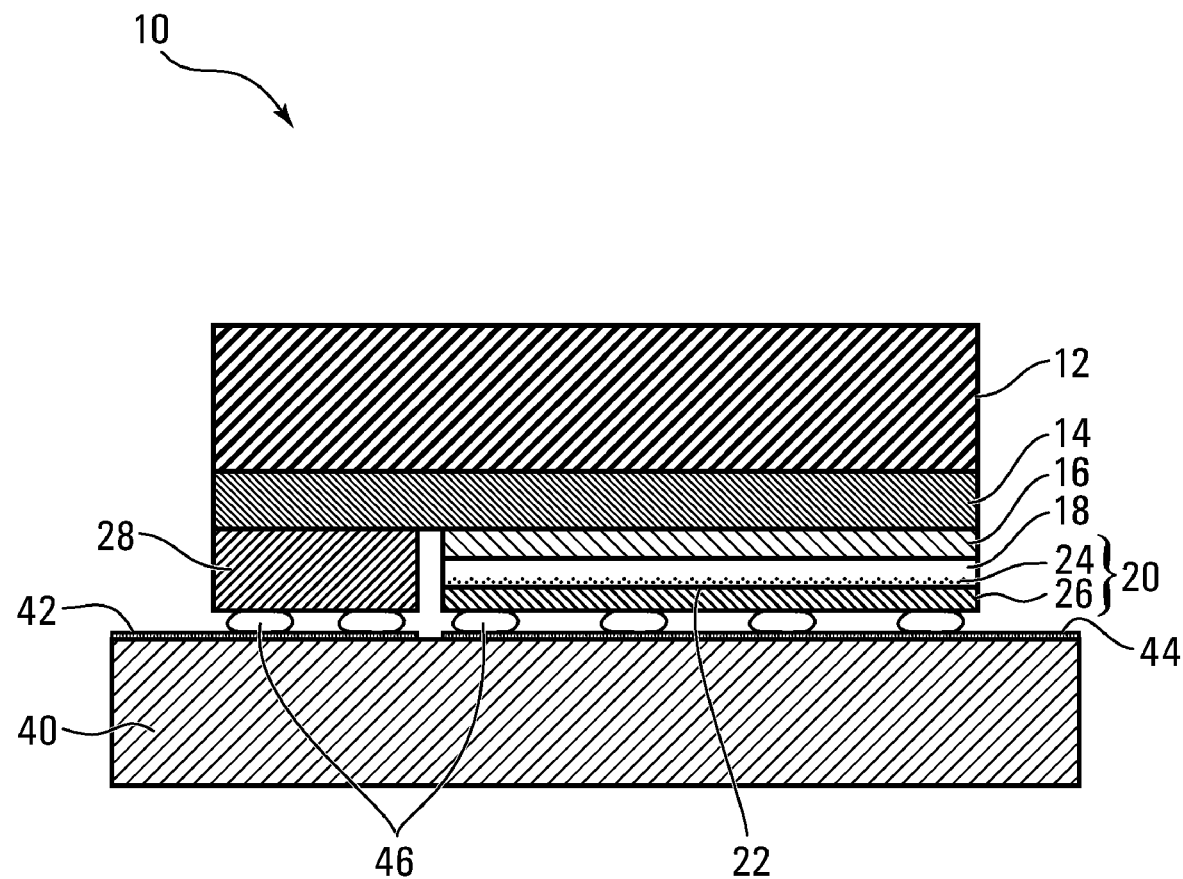
FIG. 1 is a schematic cross-sectional view of a semiconductor light-emitting structure in accordance with a first embodiment of the invention.

Referring to FIG. 1, a semiconductor light-emitting structure for use in a semiconductor light emitting apparatus according to a first embodiment of the invention is shown generally at 10.

The structure 10 includes a substrate 12 and a first cladding layer 14 on the substrate. The structure 10 also includes an active layer 16 in electrical contact with the first cladding layer 14. The active layer 16 is operable to generate light. The structure 10 further includes a second cladding layer 18 in electrical contact with the active layer 16. The structure 10 also includes a reflective electrode 20 on an outer face 22 of the second cladding layer 18.

The reflective electrode 20 includes an intermediate layer 24 of electrically conductive material. The intermediate layer 24 is at least partially diffused into the second cladding layer 18. The reflective electrode 20 further includes a reflective layer 26 on the intermediate layer 24, the reflective layer being electrically conductive and in electrical contact with the intermediate layer. The reflective layer 26 is operable to reflect light generated in the active layer 16 back through the second cladding layer 18, the active layer 16, and the first cladding layer 14, to exit the structure 10 through the substrate 12.

The intermediate layer 24 may include a conductive material that is operable to provide good ohmic contact and good adhesion between the reflective layer 26 and the second cladding layer 18.

Figure 2:
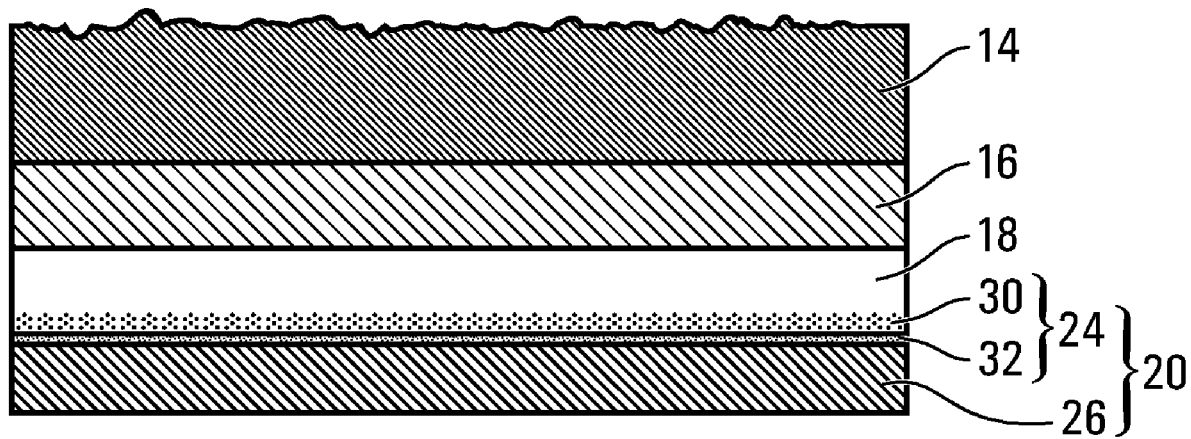
FIG. 2 is a schematic cross-sectional view of a portion of the light-emitting structure shown in FIG. 1.

The reflective electrode 20 is shown in greater detail in FIG. 2. Referring to FIG. 2, in one embodiment the intermediate layer 24 includes a diffused portion 30 in the second cladding layer 18, and an un-diffused portion 32 on the second cladding layer.

n-Type Material Growth on Substrate

Returning now to FIG. 1, in one embodiment the first cladding layer 14 includes an n-type semiconductor material and the second cladding layer 18 includes a p-type semiconductor material. In this embodiment, to provide good ohmic contact between the reflective electrode 20 and the p-type second cladding layer 18, the conductive material should have a work function as close to or greater than the sum of an electron affinity energy and a bandgap energy of the p-type semiconductor material. Semiconductor materials used in semiconductor light emitting devices typically have large bandgap energies (e.g. for Group III-nitride materials the bandgap energy ranges from 0.7 eV to 6 eV (electron volts), depending on the Indium and Aluminium composition of the material). A typical electron affinity for p-type material is in the region of 4 eV and hence the sum of the electron affinity energy and the bandgap energy for many Group III-nitride materials may range from about 4.7 eV to 10 eV. Most suitable metals have a work function in the range of 4.9 eV to 5.6 eV, and thus it may be problematic to find a suitable material that provides true ohmic contact between p-type materials and conductive electrodes. Accordingly a material having a work function as close as possible to the sum of the electron affinity energy and the bandgap energy of the p-type semiconductor material should generally be selected for the intermediate layer 24.

In this embodiment, where the reflective electrode 20 is formed on p-type semiconductor material, suitable materials for the intermediate layer 24 include, but are not limited to, rhodium (work function of about 5 eV), palladium (5.1 eV), nickel (5.2 eV), platinum (5.6 eV), gold (5.1 eV), iridium (5.3 eV), and rhenium (4.95 eV), or combinations thereof. Alternatively the intermediate layer 24 may include a conductive oxide, such as indium tin oxide or doped cuprous oxide ($Cu_2O$), for example.

In this embodiment the structure 10 further includes an electrode 28 in electrical contact with a portion of the first cladding layer 14. When a forward bias voltage is applied to the semiconductor light-emitting structure 10 (i.e. the reflective electrode 20 is made more positive than the electrode 28) a forward bias current flows through the p-type second cladding layer 18, the active layer 16, and the n-type first cladding layer 14, and photons are generated in the active layer. The photons generated in the active layer 16 are incident in all directions, and photons incident on the reflective electrode 20 are reflected back through the second cladding layer 18, the active layer 16, and the first cladding layer 14, and are emitted as light from the substrate 12. Other photons from the active layer 16 that are directly incident on the first cladding layer 14 pass through the first cladding layer and are emitted as light from the substrate 12.

In general, the structure 10 will be configured to emit light within a desired band of wavelengths, and the reflective layer 26 is formed using a material that has increased reflectivity at the configured wavelength band. For example, where the cladding layers 14 and 18 and the active layer 16 are Group III-nitride semiconductor materials, the structure 10 may emit light in a wavelength ranging from infrared wavelengths to deep ultraviolet (UV) wavelengths, depending on the alloying composition of the semiconductor material. For example, where the semiconductor material is configured to emit light at a UV wavelength, the reflective layer may comprise Aluminum, which has an increased reflectivity in UV and visible wavelength bands.

However, since aluminum has a work function of about 4.3 eV, aluminum materials will not form a good ohmic contact with the p-type cladding layer 18, resulting in a larger voltage drop across the contact, and thus a reduction in efficiency for the structure 10. In one embodiment the intermediate layer 24 includes rhodium, which has a work function of about 5 eV, and when used in combination with a reflective layer 26 that includes aluminum, the resulting reflective electrode will have good ohmic contact with the second cladding layer 18 and also have increased reflectivity in the UV wavelength band. The reflective layer 26 may also include materials such as rhodium, palladium, magnesium, gold, or nickel, for example. Alternatively, the reflective layer 26 may also include combinations of these and/or other metals.

Alternatively the reflective layer 26 may include silver, which has a good reflectivity in near-UV and visible wavelength bands. Silver has a work function of about 4.3 eV, and does not form good ohmic contact with the p-type cladding layer 18. Furthermore silver materials may also suffer poor adhesion to nitride semiconductor materials. By including an intermediate layer 24, deposited in accordance with the present invention, a reflective silver electrode having good ohmic contact and high reflectivity in the near-UV and visible wavelength bands may be formed.

Flip-Chip Mounting

In the embodiment shown in FIG. 1, the structure 10 is configured for flip-chip mounting to a sub-mount 40 to form a semiconductor light emitting apparatus. The sub-mount 40 includes electrical contact areas 42 and 44 corresponding to the electrodes 28 and 20 respectively. Flip-chip mounting refers to a mounting technique wherein the semiconductor light-emitting structure 10 is fabricated on a substrate (such as the substrate 12) and then the structure is flipped over and the electrodes 20 and 28 are bonded to the electrical contact areas 42 and 44 of the sub-mount 40, using electrically conductive material beads 46 (e.g. a gold and tin alloy). The bonding may involve heating the structure 10 to a temperature above the melting point of the conductive material beads 46, which causes the beads to melt or reflow, thus bonding the electrodes 28 and 20 to the electrical contact areas 42 and 44. Alternatively, in some embodiments, bonding may involve thermal compression, friction bonding, or diffusion bonding, for example. The reflective layer 26 may have a thickness of between about 100 nm and about 1 μm for flip-chip mounting.

In some embodiments the substrate 12 may be removed before or after flip-chip mounting the structure. The substrate 12 may be removed by laser-induced separation or chemical etching, in which case the light generated in the active layer 16 exits the structure 10 through the first cladding layer 14.

p-Type Material Growth on Substrate

Referring again to FIG. 1, in another embodiment the first cladding layer 14 includes a p-type semiconductor material and the second cladding layer 18 includes an n-type semiconductor material. In this case, to provide good ohmic contact between the reflective electrode 20 and the n-type second cladding layer 18, the conductive material used for the intermediate layer 24 should have a work function close to or smaller than an electron affinity energy of the n-type semiconductor material. A typical electron affinity for n-type material is in the region of 4 eV, and thus for good ohmic contact, suitable metals for the intermediate layer 24 should have a low work function e.g. aluminum (4.3 eV), titanium (4.3 eV), chromium (4.5 eV), vanadium, (4.3 eV), and tantalum (4.2 eV), for example.

Process

A process for forming the reflective electrode 20 on the second cladding layer 18 is described with reference to FIG. 3.

Figure 3A:
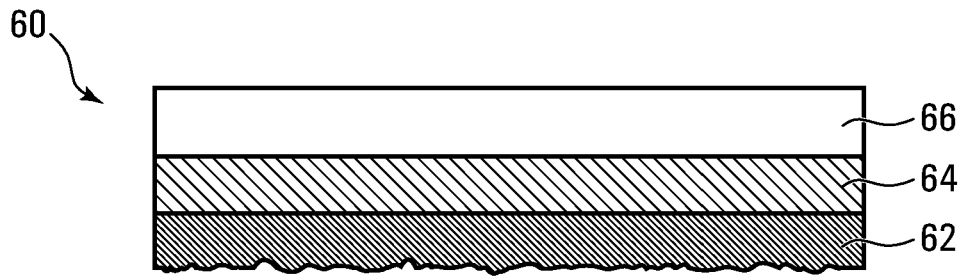
FIG. 3A-3E are a series of cross sectional views cross-sectional views illustrating the processing of a light-emitting structure in accordance with one embodiment of the invention.

Referring to FIG. 3A, a portion of a semiconductor light-emitting apparatus is shown at 60. The apparatus 60 includes a first cladding layer 62, epitaxially grown on a substrate (not shown in FIG. 3). The apparatus 60 also includes an active layer 64, epitaxially grown on the first cladding layer 62, and a second cladding layer 66, epitaxially grown on the active layer 64.

Figure 3B:
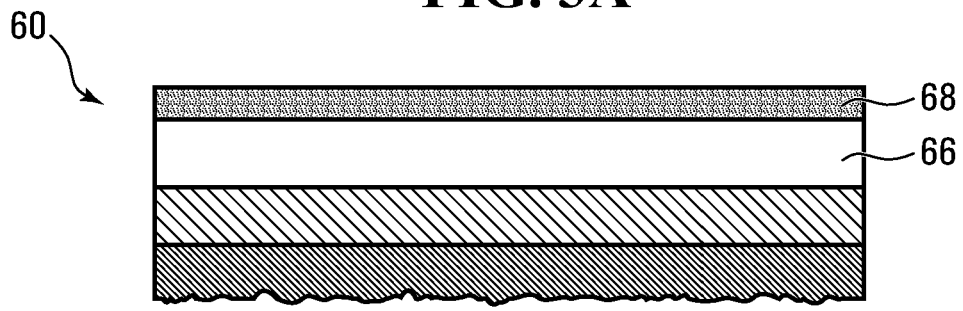

Referring to FIG. 3B, the process begins by depositing an intermediate layer 68 on the second cladding layer 66. In one embodiment the intermediate layer 68 comprises a metal, such as rhodium, which provides good ohmic contact with the second cladding layer 66 as described above. The metal may be deposited on the second cladding layer 66 using a thermal evaporator (not shown). Alternatively the metal may be deposited on the second cladding layer 66 by electron beam evaporation, or by sputtering.

Figure 3C:
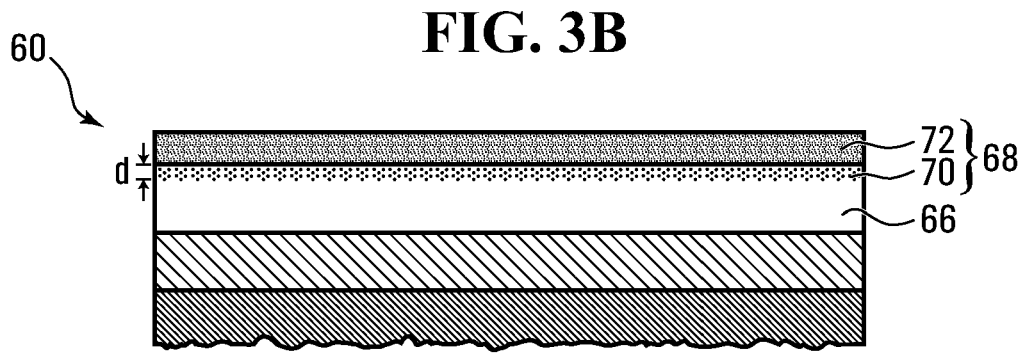

Referring to FIG. 3C, after depositing the intermediate layer, the apparatus 60 is annealed at a high temperature to cause the material in the intermediate layer 68 to at least partially diffuse into the second cladding layer 66, forming a diffused portion 70, and an un-diffused portion 72, of the intermediate layer 68. In one embodiment the annealing is performed at a temperature of about 500° C. for a diffusion time of about 30 minutes, resulting in a diffusion layer depth d of the diffused portion 70 of about 50 nm. Alternatively, the annealing temperature may be in the range of 400° C. to 600° C., and the diffusion time may be varied to achieve a diffusion layer depth d of less then or greater than 50 nm.

It is believed that diffusion of the intermediate layer 68 into the second cladding layer 66 causes the conductive material atoms to become integrated in the crystal lattice of the second cladding layer, and thus even conductive materials that have relatively high reflectivity may be used without suffering substantial light attenuation through the diffused portion 70 of the intermediate layer 68.

Figure 3D:
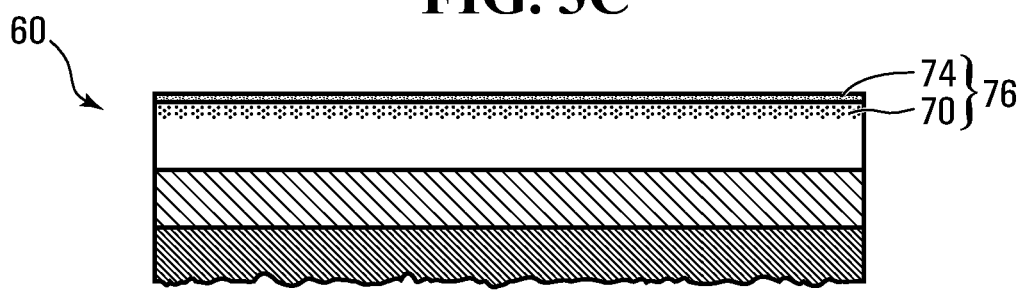

Referring to FIG. 3D, in this embodiment, the apparatus 60 is then etched to remove a majority of the un-diffused portion 72, leaving only a thin un-diffused layer 74. The diffused portion 70 and the thin un-diffused layer 74 act as a modified intermediate layer 76. In this embodiment, the un-diffused layer 74 is sufficiently thin to also cause insignificant attenuation of light. In general, the effect of any attenuation of light in the intermediate layer 76 is accentuated, since light directed toward the reflective electrode 80 passes through the intermediate layer 76 before and after being reflected by the reflective layer 78. The thin un-diffused layer 74 in combination with the diffused portion 70 facilitates use of a wider range of conductive materials for the intermediate layer 68, since the reflectivity of the material selected for the intermediate layer 76 is of less importance than its ohmic contact characteristics and its adhesion to the second cladding layer 66.

Figure 3E:
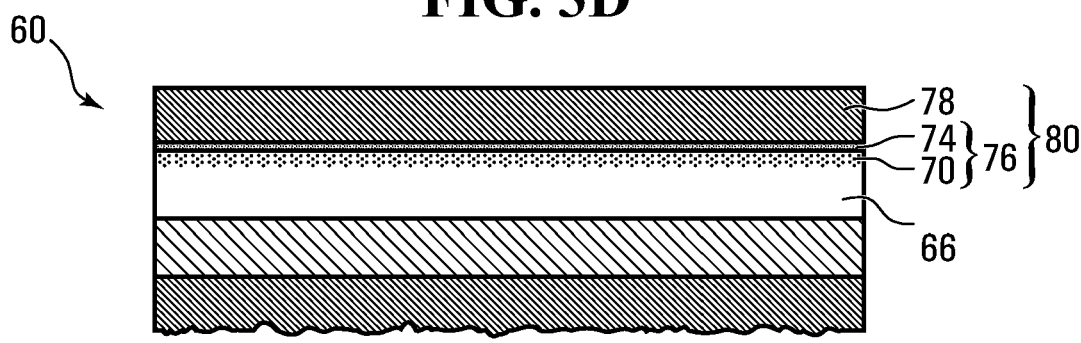

Referring to FIG. 3E, the process continues with the deposition of a reflective material to form the reflective layer 78 on the intermediate layer 76. In one embodiment the reflective layer 78 comprises a metal deposited using a thermal evaporator. Alternatively, the metal may be deposited by electron beam evaporation or by sputtering. The intermediate layer 76 and the reflective layer 78 together form a reflective electrode 80.

In the embodiment shown, the thin un-diffused layer 74 may also act as a diffusion barrier for reducing and/or preventing diffusion of the reflective layer 78 into the second cladding layer 66. Some of the materials that may be used for the reflective layer 78 may have a tendency to diffuse into the second cladding layer 66 under high temperature and/or high current operation of the apparatus 60. Over time, such diffusion may result in lowered efficiency and/or premature failure of the apparatus 60.

Advantageously, good ohmic contact lowers a forward voltage drop attributable to the reflective electrode 80 and good reflectivity minimizes light attenuation at the reflection electrode, both of which improve the efficiency of the apparatus 60.

The process is further described with reference to the following non limiting examples, in which samples were prepared in accordance with aspects of the invention and were compared with samples made in accordance with prior art techniques.

EXAMPLE 1

In a first example, reflectivity characteristics were compared between samples prepared as follows:
Sample 1: A first prior art sample was prepared comprising a 50 nm thick rhodium reflective electrode on a second cladding layer (i.e. no intermediate layer)
Sample 2: A second prior art sample was prepared comprising a 2.5 nm rhodium layer deposited on second cladding layer and a 200 nm aluminum reflective layer deposited over rhodium layer (i.e. no annealing); and
Sample 3: A sample was prepared in accordance with aspects of the invention as shown in FIG. 3. The sample had a 2.5 nm rhodium layer on the second cladding layer and was annealed at a temperature of about 500° C. for about 30 minutes and then wet etched leaving no more than 0.5 nm of undiffused rhodium. A 200 nm aluminum reflective layer was then deposited over the rhodium layer.

Reflectivity measurements for all three samples revealed that Sample 1, which did not include an intermediate layer, had an incident light reflectivity that varied from about 52% at a wavelength of 250 nm to about 63% at a wavelength of 450 nm.

Sample 2, which was not subjected to annealing, had an incident light reflectivity that varied from about 60% at a wavelength of 250 nm to about 76% at a wavelength of 450 nm.

Sample 3 had an incident light reflectivity that varied from about 72% at a wavelength of 250 nm to about 89% at a wavelength of 450 nm, showing an improvement in reflectivity of at least 12% over the prior art samples.

EXAMPLE 2

In a second example, forward voltage characteristics were compared between the prior art sample 4, and samples 5-7 prepared in accordance with the aspects of the invention as follows:
Sample 4: A prior art sample comprising a 50 nm nickel dot electrode on a second cladding layer (i.e. no intermediate layer);
Sample 5: diffused nickel intermediate layer with aluminum reflective layer (150 nm);
Sample 6: diffused palladium intermediate layer with aluminum reflective layer (150 nm); and
Sample 7: diffused rhodium intermediate layer with aluminum reflective layer (150 nm).

The forward electrode voltage for each of the samples 4-7 was measured under over-current conditions of 400 $Acm^{-2}$ 5 minutes after applying the current.

The prior art sample 4 had a forward electrode voltage of about 5.2V.

Samples prepared in accordance with aspects of the invention had forward voltages as follows:
Sample 5: about 4.8V
Sample 6: about 5.7V; and
Sample 7: about 4.7V.

Thus, samples 5 and 7 prepared in accordance with the invention exhibited a reduction in forward voltage of at least 0.4V.

While embodiments of the invention have been described with reference to flip-chip mounting of the light-emitting structure 10, other techniques may also be used to mount the structure. For example, in a vertical injection light emitting structure, the substrate is removed, reflective p- and n-electrodes contacts are deposited, and the structure may be mounted p-electrode down.

While specific embodiments of the invention have been described and illustrated, such embodiments should be considered illustrative of the invention only and not as limiting the invention as construed in accordance with the accompanying claims.

What is claimed is:

1. A semiconductor structure for use in a semiconductor light emitting apparatus, the structure comprising:
   a first cladding layer;
   an active layer in electrical contact with said first cladding layer, said active layer being operable to generate light;
   a second cladding layer in electrical contact with said active layer, said second cladding layer having an outer face;
   a reflective electrode on said outer face of said second cladding layer, said reflective electrode comprising:
      an intermediate layer of electrically conductive material, wherein said intermediate layer comprises a diffused portion of said electrically conductive material in said second cladding layer and an un-diffused portion of said electrically conductive material on said second cladding layer;
      a reflective layer on said intermediate layer, said reflective layer being electrically conductive and in electrical contact with said intermediate layer, said reflective layer being operable to reflect light generated in said active layer back through said second cladding layer, said active layer, and said first cladding layer.

2. The structure of claim 1 further comprising a substrate in contact with said first cladding layer, said substrate being operably configured to permit said light to exit the structure through said substrate.

3. The structure of claim 1 wherein said intermediate layer comprises a diffused portion of said electrically conductive material in said second cladding layer and an un-diffused portion of said electrically conductive material on said second cladding layer, said un-diffused portion being sufficiently thin to permit light generated in said active layer to be transmitted through said un-diffused portion without significant attenuation.

4. The structure of claim 1 wherein said intermediate layer comprises a diffused layer of electrically conductive material extending into the second cladding layer to a diffusion depth of about 50 nm.

5. The structure of claim 1 wherein said second cladding layer comprises p-type semiconductor material and wherein said intermediate layer comprises a material having a work function as close as possible to the sum of an electron affinity energy and a bandgap energy of said p-type semiconductor material.

6. The structure of claim 5 wherein said material comprises a metal selected from the group consisting of rhodium, palladium, nickel, platinum, gold, iridium, and rhenium.

7. The structure of claim 5 wherein said material comprises a conductive oxide.

8. The structure of claim 1 wherein said second cladding layer comprises n-type semiconductor material and wherein said intermediate layer comprises a metal having a work function close to or smaller than an electron affinity energy of said n-type semiconductor material.

9. The structure of claim 8 wherein said metal comprises a metal selected from the group consisting of aluminum, titanium, chromium, vanadium, and tantalum.

10. The structure of claim 1 wherein said first and second cladding layers and said active layer comprise group III-nitride semiconductor materials.

11. The structure of claim 1 wherein said active layer is operably configured to emit light at a first wavelength, and wherein said reflective layer comprises a material having an increased reflectivity at said first wavelength.

12. The structure of claim 11 wherein said reflective layer comprises at least one metal selected from the group consisting of aluminum, rhodium, palladium, silver, gold, magnesium, and nickel.

13. A semiconductor light emitting apparatus comprising the semiconductor light emitting structure of claim 1 and further comprising an electrode in electrical contact with said first cladding layer and whereby light is generated in said active layer when a voltage is applied between said electrode and said reflective electrode such that a forward bias current flows through said active layer.

* * * * *